United States Patent
Basceri et al.

(10) Patent No.: US 6,855,971 B2
(45) Date of Patent: Feb. 15, 2005

(54) HAZE-FREE BST FILMS

(75) Inventors: Cem Basceri, Boise, ID (US); Gurtej Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 210 days.

(21) Appl. No.: 09/971,955

(22) Filed: Oct. 4, 2001

(65) Prior Publication Data

US 2002/0033497 A1 Mar. 21, 2002

Related U.S. Application Data

(62) Division of application No. 09/382,753, filed on Aug. 25, 1999, now Pat. No. 6,319,764.

(51) Int. Cl.[7] .......................... H01L 27/08; H01L 29/76; H01L 29/94; H01L 31/119
(52) U.S. Cl. ....................................... 257/295; 257/306
(58) Field of Search ................................. 257/295–310; 438/3, 241–254

(56) References Cited

U.S. PATENT DOCUMENTS

| | | |
|---|---|---|
| 5,185,689 A | 2/1993 | Maniar |
| 5,335,138 A | 8/1994 | Sandhu et al. |
| 5,406,445 A | 4/1995 | Fujii et al. |
| 5,506,166 A | 4/1996 | Sandhu et al. |
| 5,581,436 A | 12/1996 | Summerfelt et al. |

(List continued on next page.)

FOREIGN PATENT DOCUMENTS

JP 406333772 A * 12/1994 ............ H01B/4/06

WO WO95/25340 9/1995

OTHER PUBLICATIONS

Joo, "Fabrication and Characterization of MOCVD (Ba, Sr)TiO3 Thin Films for High Density Capacitors", Proceeding of 1997 5th International Conference an VLSI and CAD, The Secretariat of ICVC '97, 1997.

(List continued on next page.)

*Primary Examiner*—Cuong Nguyen
(74) *Attorney, Agent, or Firm*—Knobbe, Martens, Olson & Bear, LLP

(57) ABSTRACT

Described herein is a method for producing a haze-free (Ba, Sr)TiO$_3$ (BST) film, and devices incorporating the same. In one embodiment, the BST film is made haze-free by depositing the film with a substantially uniform desired crystal orientation, for example, (100), preferably by forming the film by metal-organic chemical vapor deposition at a temperature greater than about 580° C. at a rate of less than about 80 Å/min, to result in a film having about 50 to 53.5 atomic percent titanium. In another embodiment, where the BST film serves as a capacitor for a DRAM memory cell, a desired {100} orientation is induced by depositing the bottom electrode over a nucleation layer of NiO, which gives the bottom electrode a preferential {100} orientation. BST is then grown over the {100} oriented bottom electrode also with a {100} orientation. A nucleation layer of materials such as Ti, Nb and Mn can also be provided over the bottom electrode and beneath the BST film to induce smooth, haze-free BST growth. Haze-free BST film can also be favored by forming the bottom electrode at high temperatures close to those used for BST deposition, and without a vacuum break between the bottom electrode and BST deposition.

27 Claims, 5 Drawing Sheets

U.S. PATENT DOCUMENTS

| | | | |
|---|---|---|---|
| 5,717,234 A | | 2/1998 | Si et al. |
| 5,781,404 A | * | 7/1998 | Summerfelt et al. ........ 257/295 |
| 5,783,253 A | | 7/1998 | Roh |
| 5,822,175 A | | 10/1998 | Azuma |
| 5,889,299 A | * | 3/1999 | Abe et al. ................... 257/295 |
| 6,010,931 A | | 1/2000 | Sun et al. |
| 6,117,482 A | | 9/2000 | Kawahara et al. |
| 6,136,639 A | | 10/2000 | Seon |
| 6,238,966 B1 | * | 5/2001 | Ueda et al. ................. 438/253 |
| 6,277,436 B1 | | 8/2001 | Stauf et al. |
| 6,285,051 B1 | | 9/2001 | Ueda et al. ................. 257/298 |
| 6,319,764 B1 | | 11/2001 | Basceri et al. |
| 6,339,527 B1 | | 1/2002 | Farooq et al. |

OTHER PUBLICATIONS

Hiromi Itoh et al., "Integration of BST Thin Film for Dram Fabrication", Integrated Ferroelectrics, 1995, vol. 11, pp. 101–109.

C. Basceri, "An Important Failure Mechanism in MOCVD (Ba,Sr) TiO Thin Films: Resistance Degradation", Ferroelectric Thin Films IV, Materials Research Society, 1998, pp. 9–14.

* cited by examiner

○ $Ti^{4+}$: at the body center

⊘ $Ba^{2+}$, $Sr^{2+}$: at corners

⊕ $O^{2-}$: at face centers

HAZE-FREE BST FILMS

CROSS REFERENCE TO RELATED APPLICATION

This application is a divisional of U.S. patent application Ser. No. 09/382,753, filed Aug. 25, 1999 now U.S. Pat. No. 6,319,764. +gi

REFERENCE TO GOVERNMENT CONTRACT

This invention was made with United States Government support under Contract No. DABT63-97-C-0001, awarded by the Advanced Research Projects Agency (ARPA). The United States Government has certain rights in this invention.

BACKGROUND OF THE INVENTION

1. Field of the Invention

The present invention relates to $(Ba,Sr)TiO_3$ (BST) thin films, and more particularly to a method for creating a haze-free BST thin film with a high dielectric constant.

2. Description of the Related Art $(Ba,Sr)TiO_3$ (BST) films are commonly used as dielectric materials for capacitors, gate dielectrics and high frequency electronic circuits. More particularly, BST films have found application as capacitors in dynamic random access memory (DRAM) cells. A typical DRAM cell comprises a charge storage capacitor (or cell capacitor) coupled to an access device such as a metal-oxide semiconductor field effect transistor (MOSFET). The MOSFET functions to apply or remove charge on the capacitor, thus affecting a logical state defined by the stored charge. The amount of charge stored on the capacitor is determined by the capacitance, $C = \epsilon \epsilon_0 A/d$, where $\epsilon$ is the dielectric constant of the capacitor dielectric, $\epsilon_0$ is the vacuum permittivity, A is the electrode (or storage node) area, and d is the interelectrode spacing. The conditions of DRAM operation such as operating voltage, leakage rate and refresh rate, will in general mandate that a certain minimum charge be stored by the capacitor.

BST is desirable for such applications because of its high dielectric constant, low DC leakage, low dispersion up to high frequencies and stable operation at high temperatures. The high dielectric constant of BST thereby gives the material the ability to yield high capacitance when placed between a pair of electrodes. BST films grown for applications such as DRAM capacitors are typically made using metal-organic chemical vapor deposition (MOCVD) or sputtering. However, MOCVD growth of such films typically leads to problems such as haze which reduces the dielectric constant of the material and increases leakage currents. Specifically, haze is caused by the growth of spatially correlated, non-textured BST, which in turn creates discernible optical scatter and a cloudy or hazy appearance in the film. For example, haze may be created when a film desired to be grown in a (100) orientation has orientations other than (100), such as (110) or (111), thereby disrupting the texture of the film. When BST is used in a capacitor structure, haze causes its capacitance to decrease as much as 50% and leakage currents to increase by a factor of 10 to 1000 with respect to smooth films.

Furthermore, electrodes and other materials on which BST films are deposited often suffer from process-induced defects such as hillock formation which may severely limit performance. Hillocks are small nodules which form when the electrode or other material is deposited or subjected to post-deposition processing. For example, hillocks can result from excessive compressive stress induced by the difference in thermal expansion coefficient between the BST film and the underlying electrode material during post-deposition heating steps. Such thermal processing is typical in the course of semiconductor fabrication. Hillock formation may create troughs, breaks, voids and spikes along the electrode surface, thereby leading to uneven BST growth and stress in the BST film.

SUMMARY OF THE INVENTION

Accordingly, it is an object of this invention to produce a haze-free BST thin film with a high dielectric constant and low leakage currents. It is also an object of this invention to produce a BST thin film that has low stress. It is further an object of this invention to produce an electrode or other base material onto which a BST film is deposited that is smooth and hillock-free to improve the properties of the subsequently deposited BST film.

These objects are achieved generally through the control of one or more processing conditions in the fabrication of the BST film. Briefly stated, haze can be reduced by increasing the BST deposition temperature, decreasing the deposition rate and increasing the atomic percent of titanium in the BST film. These conditions favor the formation of a highly textured film, i.e., a film with a substantially uniform desired crystal orientation. Furthermore, use of highly textured substrates, bottom electrodes or nucleation layers also favors haze-free and low stress BST films. Moreover, the above-stated objects are achieved by forming a substrate layer such as a bottom electrode and the BST film in a clustered tool.

In one aspect of the present invention, a method of forming a haze-free BST film over a substrate assembly is provided. The method comprises supplying BST sources into a chamber, and inducing textured growth of the BST film over the substrate assembly in a substantially uniform desired crystal orientation. In one preferred embodiment, the BST film is deposited at a rate of less than about 80 Å/min at a chamber temperature above about 580° C. The BST film is preferably grown using metal-organic chemical vapor deposition (MOCVD), and results in a film having a concentration of about 50 to 53.5 atomic percent titanium.

In another aspect of the present invention, a substantially haze-free BST thin film is provided. The BST thin film has a textured structure with a substantially uniform crystal orientation.

In another aspect of the present invention, the method of forming the substantially haze-free BST film first comprises forming a nucleation layer over a substrate assembly. Then, the BST film is formed over the nucleation layer, the BST film being formed having a substantially uniform crystal orientation. In one preferred embodiment, the nucleation layer is NiO, and an orientation layer such as platinum is formed over the nucleation layer before forming the BST film. The orientation layer preferably has a desired crystal orientation to induce the same orientation in the subsequently formed BST film. In another preferred embodiment, the nucleation layer is made of Ti, Nb or Mn to compensate for defects in the subsequently formed BST film.

In another aspect of the present invention, a thin film structure is provided comprising a nucleation layer and a BST film over the nucleation layer having a substantially uniform crystal orientation. In one embodiment, an orientation layer is preferably provided over the nucleation layer underneath the BST film. In another embodiment, the BST film is directly on top of the nucleation layer.

In another aspect of the present invention, a method of forming a BST capacitor structure is provided. A first electrode material is formed over a substrate assembly, followed by forming a BST film over the first electrode material. The BST film being formed has a substantially uniform crystal orientation. A second electrode material is then formed over the BST film. The first electrode material is preferably formed in a vacuum at a temperature between about 500 and 550° C., while the BST film is preferably formed at a temperature greater than about 580° C. The BST film is preferably deposited in a vacuum chamber, with the first electrode material and the BST film formed without a vacuum break in between.

In another aspect of the present invention, a capacitor structure is provided comprising a base layer, a bottom electrode formed over the base layer, a BST film formed over the bottom electrode, and a top electrode formed over the BST film. The BST film has a substantially uniform orientation, and preferably comprises between about 50 and 53.5 atomic percent titanium. Preferably, a nucleation layer of NiO is provided between the base layer, which is preferably polysilicon, and the bottom electrode, which is preferably platinum. A second or alternative nucleation layer may be provided between the bottom electrode and the BST film, and more preferably comprises a material such as Ti, Mn or Nb.

DETAILED DESCRIPTION OF THE PREFERRED EMBODIMENTS

Briefly stated, the objects of the present invention are accomplished by providing methods and apparatus that favor the growth of textured BST films with a substantially uniform desired crystal orientation. The preferred embodiments of the present invention describe a BST thin film formed as a capacitor in a DRAM memory cell. However, it will be appreciated that the teachings disclosed herein are applicable to any method or device where a haze-free BST film with high dielectric constant is desired. As used herein, the term BST can refer not only to $(Ba,Sr)TiO_3$, but also to $BaTiO_3$, $SrTiO_3$ and any modifications to these materials through isovalent substitution or the use of donor and acceptor dopants. Furthermore, the methods and apparatus taught herein are applicable to other materials similar to BST where it is desired to reduce haze and maintain a high dielectric constant.

Figure 1:
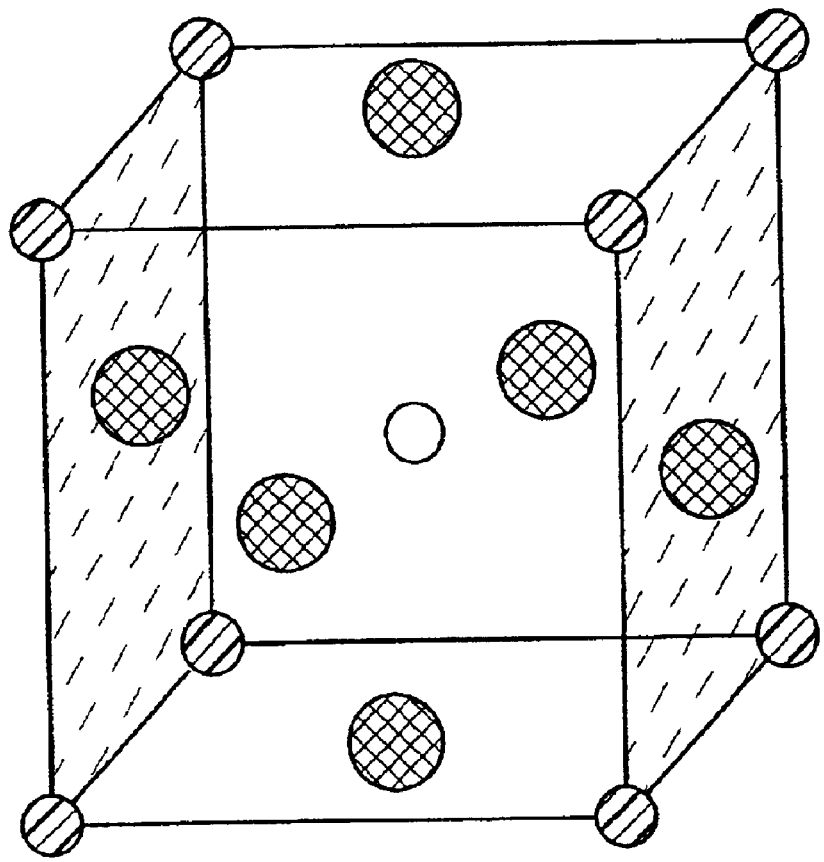
FIG. 1 is a schematic view of the crystal structure of BST.

FIG. 1 illustrates the BST crystal structure. As can be seen, BST has a cubic crystal structure, more particularly, a perovskite crystal structure with $Ba^{2+}$ and $Sr^{2+}$ at the corners, $O^{2-}$ at the faces and $Ti^{4+}$ at the center. The (100) planes of the BST crystal structure are shaded in FIG. 1. As described below, the illustrated embodiments of the present invention provide textured growth of the deposited BST film along (100) planes. However, this invention is not to be limited to producing a BST film with only a substantially uniform (100) orientation. It will therefore be appreciated that the methods and processing conditions described herein are also applicable to producing a BST film with a desired crystal orientation along other planes in the {100} family, as well as planes in the {110}, {111} and other families of planes found in the BST crystal structure.

Figure 2:
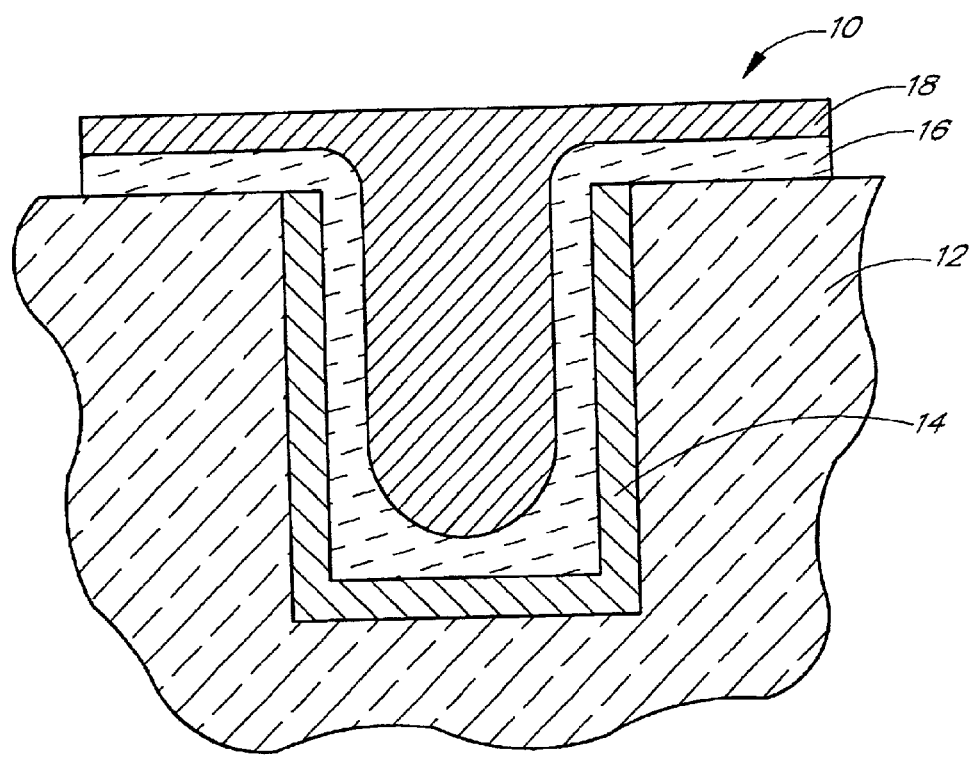
FIG. 2 is a schematic cross-sectional view of a capacitor structure for use in a DRAM memory cell incorporating a BST thin film.

FIG. 2 illustrates a schematic capacitor structure 10 for use in a DRAM memory cell. At the bottom of the cell 10 is a base layer 12, preferably made of a material such as polysilicon. A bottom electrode or storage node 14 is formed, preferably by chemical vapor deposition, over the base material 12. This bottom electrode is preferably platinum (Pt) or ruthenium (Ru). Other electrodes, such as Ir, $IrO_x$, $RuO_x$ Pt—Rh, Mo and Pd may also be used. A thin film 16 of BST is deposited over the bottom electrode 14. A top electrode or cell electrode 18 is preferably deposited by chemical vapor deposition over the BST thin film 16, and is preferably made of material similar to the bottom electrode, such as Pt or Ru. In the exemplary capacitor structure 10, the bottom electrode 14 is preferably grown to a thickness of about 400 Å. The BST film 16 grown over the bottom electrode 14 preferably has a thickness of about 150 to 300 Å. At the top of the structure 10, the top electrode 18 preferably has a thickness of about 300 Å.

Optionally, a barrier layer may be formed between the polysilicon base layer 12 and the electrode 14 to prevent interdiffusion between the layers and the formation of $SiO_2$ on top of the electrode surface. Appropriate barrier layers include TiN/Ti, TiAlN, TaSiN, WSiN, and may be formed by chemical vapor deposition or physical vapor deposition, as would be known to one skilled in the art.

Figure 3:
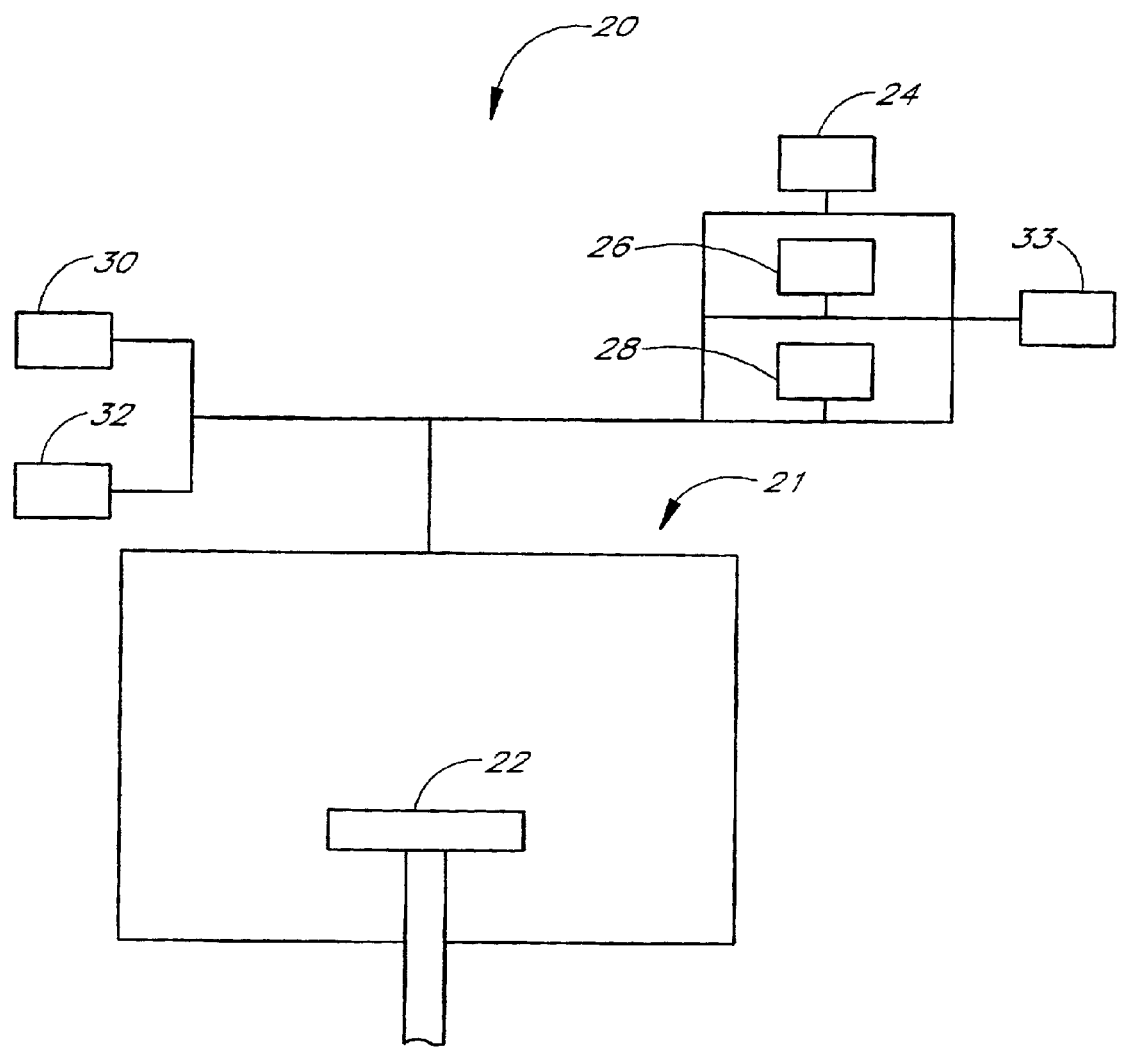
FIG. 3 is a schematic view of a MOCVD processing apparatus used to deposit a BST thin film.

The BST film 16 is formed over the bottom electrode 14 preferably using metal-organic chemical vapor deposition (MOCVD). A schematic MOCVD apparatus 20 is illustrated in FIG. 3, including a chamber 21 with a substrate assembly 22 located therein. Suitable BST sources, including a barium source 24, a strontium source 26, and a titanium source 28, are provided into the chamber, as would be known to one skilled in the art. For example, suitable barium and strontium sources include $Ba(THD)_2$ and $Sr(THD)_2$, where THD denotes 2,2,6,6-tetramethyl-3,5-heptanedionate. Suitable Ti sources include bis(isopropoxy) bis(2,2,6,6-tetramethyl-3,5-heptanedionate) titanium $(Ti(O—i—Pr)_2(THD)_2)$. These precursors may be adducted with tetraglyme. Solvents used for these precursors may be butyl acetate or tetrahydrafuran, as would be known to one skilled in the art. A carrier gas 33 such as Ar is preferably used to carry vapor from the sources into the reaction chamber 21. Oxidizers 30 and 32 of $O_2$ and $N_2O$ gas, respectively, are preferably used.

Deposition of the BST film 16 is preferably conducted in a chamber 21 at a pressure of about 100 mtorr to 10 torr. In one preferred embodiment, it has been found that chamber temperatures greater than about 580° C. are effective in reducing haze. For high temperature BST processes, deposition preferably occurs at a chamber temperature of between about 600 and 680° C., and a substrate assembly temperature of about 500 to 580° C. For low temperature BST processing, deposition preferably occurs at a chamber temperature of between about 400 and 500° C., and a substrate temperature of about 350 and 450° C. The BST film 16 is preferably deposited at a rate of about 10 to 100 Å/min, more preferably less than about 80 Å/min.

The resulting BST film 16 has a titanium concentration of between about 50 and 53.5 atomic percent. It has also been found that when titanium concentrations of about 50–52 atomic percent yield haze, increasing the titanium concentration to about 52–53 atomic percent can reduce haze. The ratio of Ba to Sr in the resulting film is preferably between about 70/30 to 50/50.

Figure 4A:
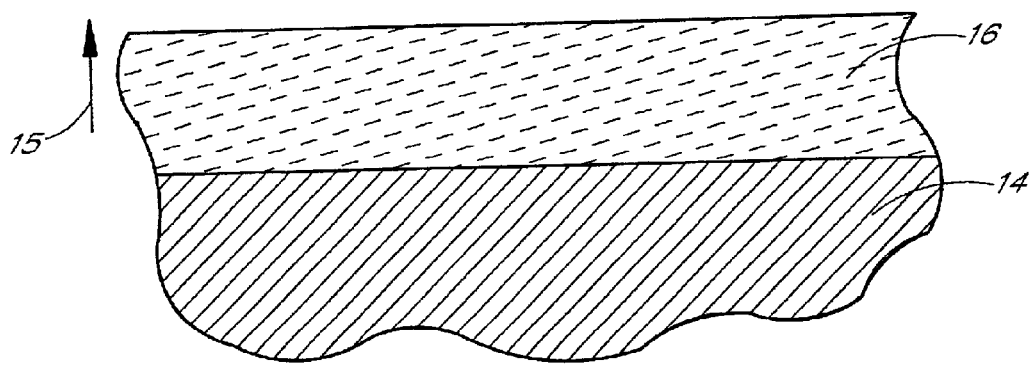
FIG. 4A is a schematic cross-sectional view of a (100)-oriented BST thin film deposited over a platinum bottom electrode.
Figure 4B:
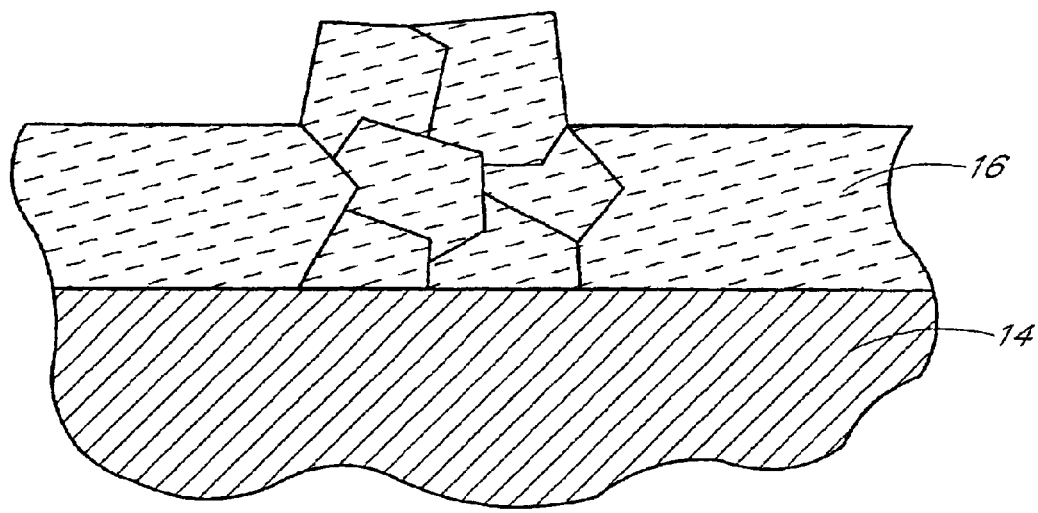
FIG. 4B is a schematic cross-sectional view of a polycrystalline BST thin film deposited over a platinum bottom electrode.

FIG. 4A illustrates a BST film 16 formed over a platinum electrode 14. The conditions described above preferentially form the BST film 16 with a substantially uniform orientation. For example, substantially all of the BST growth may be with a (100) orientation. In other words, the direction of growth of the BST film 16 as indicated by arrow 15 is normal to (100) planes in the BST film. This (100) orientation leads to a more uniform grain structure and a smoother surface, thereby producing a textured structure with a less cloudy or hazy appearance. By contrast, FIG. 4B illustrates a BST film 16 which is not uniformly oriented. The structure shown in FIG. 4B is polycrystalline, with growth occurring in more than one direction and thus deviating from the preferred orientation. For example, when (100) is the desired orientation, the structure shown in FIG. 4B may be caused by deviating growth with (110) or (111) orientations. This causes a more disrupted grain structure and an uneven surface, thereby leading to haze. It will be appreciated that although the preferred embodiments describe growth with a substantially uniform (100) orientation, uniform growth with other orientations are contemplated as well.

It has been found that the substantially uniform orientation illustrated in FIG. 4A is induced by the high temperatures, preferably above about 580° C., used for BST deposition, which favors equilibrium. Moreover, the slow deposition rate used, preferably less than about 80 Å/min as described above, favors the formation of a more stable film, while the high Ti concentration in the BST produced, preferably between about 50 and 53.5 atomic percent, also favors a more haze-free film.

As a modification to the embodiments described above, the use of one or more nucleation layers either above or below the bottom electrode 14, or both, favors a desired direction of crystal growth. For example, when the BST thin film 16 is grown over a bottom electrode 14 such as Pt, a desired {100} orientation of the BST film can be favored by using a thin NiO nucleation layer or similar material. Normal growth of Pt over a base material 12 such as silicon is along the {111} planes of Pt. This leads to the problem that BST films grown over a Pt electrode 14 may not be {100} oriented, but rather {111} oriented.

Figure 5:
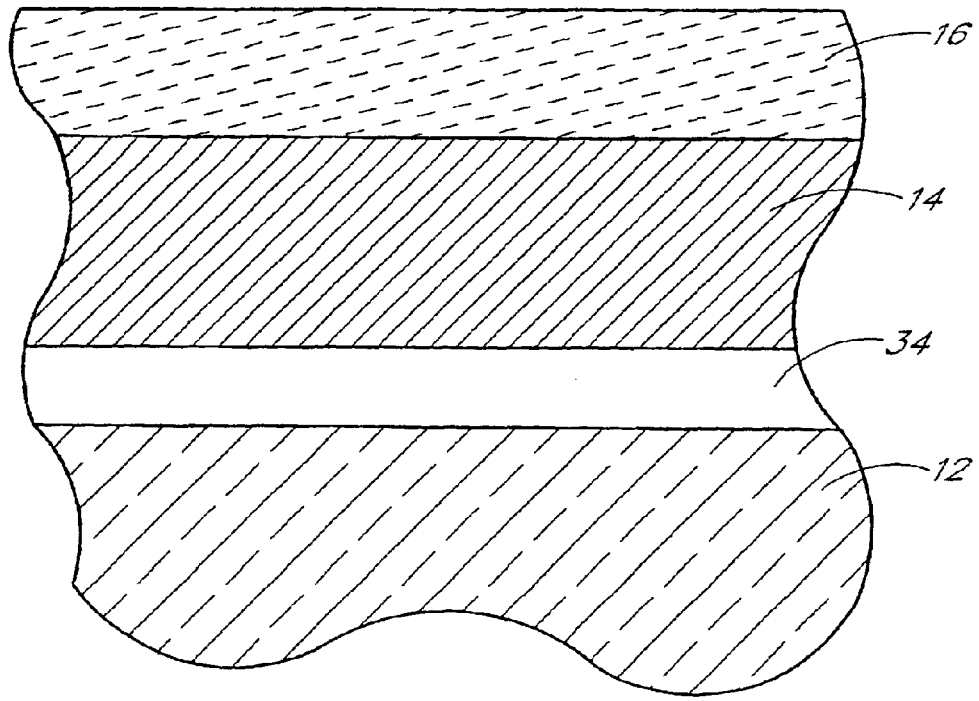
FIG. 5 is a schematic cross-sectional view depicting the deposition of a BST thin film over a platinum bottom electrode using a nucleation layer of NiO.

As shown in FIG. 5, this problem is avoided by depositing a thin layer 34 of NiO over the base material 12 to induce {100}-oriented Pt. NiO may be grown by sputtering or metal-organic chemical vapor deposition. The NiO nucleation layer 34 preferentially induces a highly textured {100} orientation in the Pt layer 14. The Pt layer in turn acts as an orientation layer that induces the same orientation in the subsequently deposited BST film 16. This is because both Pt and BST have substantially the same lattice constant of about 3.9 to 4 Å. Thus, the {100} orientation of the Pt layer 14 is preferentially transferred to the BST film 16. It is also contemplated that other nucleation or orientation layers may be used to induce growth of subsequent layers with other desired crystal orientations.

Figure 6:
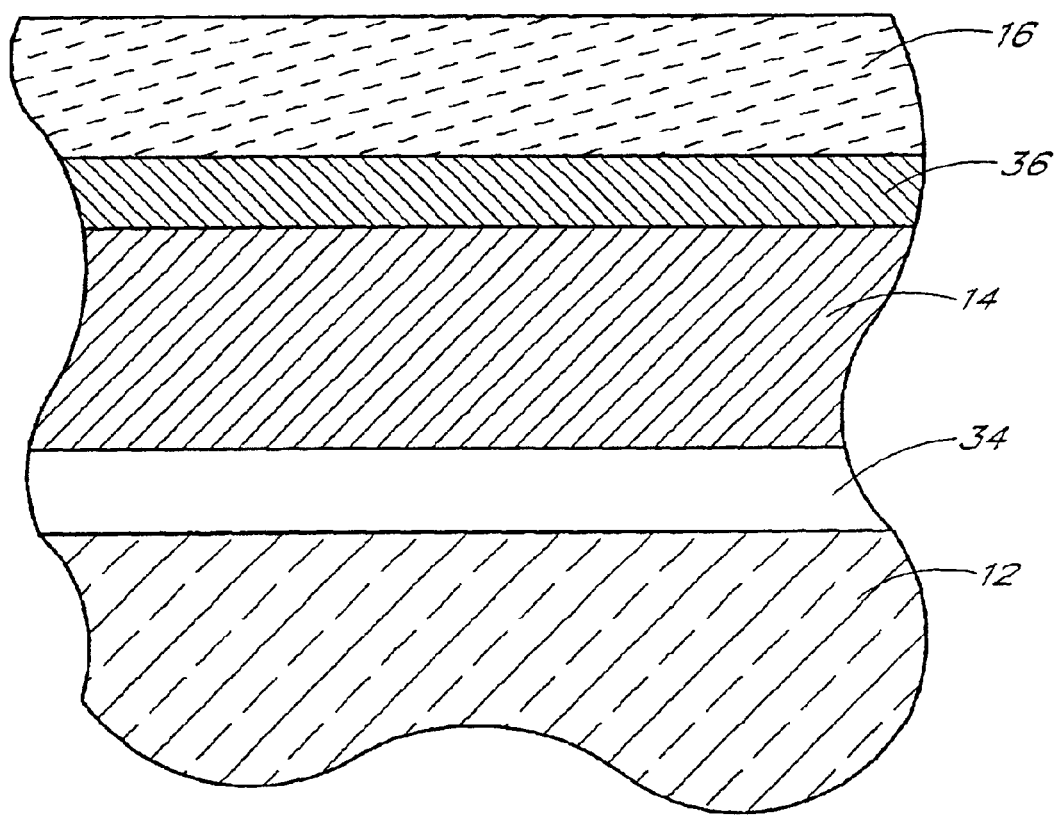
FIG. 6 is a schematic cross-sectional view depicting the deposition of a BST thin film over a platinum bottom electrode using a nucleation layer of Ti, Nb or Mn.

In another modification to the embodiments described above, haze can also be prevented by providing a thin nucleation layer over the bottom electrode 14. As shown in FIG. 6, a thin layer 36 of material such as Ti, Nb or Mn is grown over the bottom electrode 14. The layer 36 is preferably deposited using a physical vapor deposition technique such as sputtering to a thickness of less than about 50 Å. The layer 36 preferentially induces a more uniform, haze-free BST film 16 by compensating for defects formed in the subsequently deposited BST film. More particularly, the nucleation layer 36 can act as either a donor or acceptor dopant material to correct for defects in the BST film. The nucleation layer 36 also impacts the nucleation kinetics of the BST film to enable a more uniform growth.

In another embodiment, the properties of the BST film formed according to the embodiments described above can be improved by forming a smoother bottom electrode layer 14, which thereby leads to an improved haze-free BST film. In particular, by reducing the number of hillocks and increasing the smoothness of the bottom electrode layer 14, the deposited BST film will experience less stress and have a more uniform growth. Preferably, the smoothness of the bottom electrode 14 is accomplished by depositing the electrode at a high temperature close to that of the BST deposition. More particularly, it has been found that for high temperature BST processing, depositing the bottom electrode at temperatures as high as about 500 to 550° C. reduces the stress in the subsequently deposited BST film.

The bottom electrode 14 is also preferably deposited using a clustered deposition technique. By this technique, the bottom electrode 14 is deposited under vacuum conditions, and then the BST film 16 is deposited thereover without a vacuum break. By eliminating the vacuum break and forming both the bottom electrode and the BST film in a clustered tool, it has been observed that the number of hillocks in the bottom electrode 14 is reduced, while also reducing the stress in the layer 14.

It should be appreciated that the embodiments described above are purely exemplary, and various modifications can be made as would be known to one of skill in the art. Accordingly, the scope of the present invention should be defined only by the claims that follow.

What is claimed is:

1. A thin film structure, comprising:
   a substrate;
   an electrode formed over said substrate;
   a nucleation layer for improving the uniformity of a crystal orientation of a BST film formed thereon, wherein said nucleation layer consists essentially of a donor or acceptor dopant material, said nucleation layer being formed over said electrode; and
   a BST film over the nucleation layer having a substantially uniform crystal orientation.

2. The thin film structure of claim 1, wherein the the donor or acceptor dopant material is selected from the group consisting of Ti, Nb and Mn.

3. The thin film structure of claim 1, wherein the donor or acceptor dopant material is a metal.

4. The thin film structure of claim 3, wherein the electrode has a {100} orientation to induce a {100} orientation in the BST film.

5. The thin film structure of claim 4, wherein the electrode is platinum.

6. The thin film structure of claim 1, wherein the BST film comprises between about 50 and 53.5 atomic percent Ti.

7. The thin film structure of claim 1, wherein the nucleation layer has a thickness of less than about 50 Å.

8. The thin film structure of claim 1, wherein the BST film has a thickness of about 150 to 300 Å.

9. A thin film structure, comprising:

a substrate assembly;

a first nucleation layer formed over the substrate assembly;

an orientation layer formed over the first nucleation layer;

a second nucleation layer formed over the orientation layer; and a BST film formed over the second nucleation layer, wherein the orientation layer and the BST film have substantially the same desired crystal orientation wherein the first and second nucleation layers aid in forming the BST film with a substantially uniform crystal orientation, wherein the second nucleation layer consists essentially of a donor or acceptor dopant to correct for defects in the BST film.

10. The thin film structure of claim 9, wherein the first nucleation layer comprises NiO.

11. The thin film structure of claim 9, wherein the orientation layer and the BST film have a {100} orientation.

12. The thin film structure of claim 9, wherein the orientation layer comprises an electrode material.

13. The thin film structure of claim 9, wherein the orientation layer is made of a material selected from the group consisting of Pt, Ru, $RuO_x$, Ir, $IrO_x$, Pt—Rh, Pd and Mo.

14. The thin film structure of claim 9, wherein the orientation layer is made of platinum.

15. The thin film structure of claim 14, wherein the second nucleation layer comprises a material selected from the group consisting of Ti, Nb and Mn.

16. The thin film structure of claim 9, wherein the second nucleation layer has a thickness of less than about 50 Å.

17. The thin film structure of claim 9, wherein the BST film has a thickness of about 150 to 300 Å.

18. The thin film structure of claim 9, further comprising an electrode formed over the BST film.

19. The thin film structure of claim 9, wherein the substrate assembly includes polysilicon.

20. The thin film structure of claim 9, wherein the BST film comprises between about 50 and 53.5 atomic percent titanium.

21. The thin film structure of claim 9, wherein the BST film comprises between about 52 and 53 atomic percent titanium.

22. A thin film structure, comprising:

a substrate assembly;

an electrode material formed over the substrate assembly;

a nucleation layer formed over the electrode material; and a BST film formed over the nucleation layer;

wherein the nucleation layer consists essentially of a metal selected from the group consisting of Ti, Nb and Mn.

23. The thin film structure of claim 22, wherein the electrode material is Pt.

24. The thin film structure of claim 22, wherein the nucleation layer is Ti.

25. The thin film structure of claim 22, wherein the nucleation layer is Nb.

26. The thin film structure of claim 22, wherein the nucleation layer is Mn.

27. The thin film structure of claim 22, wherein the nucleation layer has a thickness of less than about 50 Å.

* * * * *